United States Patent [19]
Shinohara

[11] Patent Number: 6,037,633
[45] Date of Patent: Mar. 14, 2000

[54] SEMICONDUCTOR DEVICE

[75] Inventor: Toshiro Shinohara, Kanagawa, Japan

[73] Assignee: Nissan Motor Co., Ltd., Yokohama, Japan

[21] Appl. No.: 08/962,289

[22] Filed: Oct. 31, 1997

[30] Foreign Application Priority Data

Nov. 1, 1996 [JP] Japan ..................................... 8-291660

[51] Int. Cl.$^7$ ........................ H01L 29/76; H01L 31/062
[52] U.S. Cl. ........................ 257/342; 257/331; 257/341
[58] Field of Search ................... 257/331, 341, 257/342

[56] References Cited

U.S. PATENT DOCUMENTS

| | | | |
|---|---|---|---|
| 3,975,221 | 8/1976 | Rodgers | 148/191 |
| 4,438,448 | 3/1984 | Harrington et al. | 357/23 |
| 5,034,785 | 7/1991 | Blanchard | 357/23.4 |
| 5,192,989 | 3/1993 | Matsushita et al. | 257/342 |
| 5,283,454 | 2/1994 | Cambou | 257/328 |
| 5,352,915 | 10/1994 | Hutchings et al. | 257/361 |
| 5,378,914 | 1/1995 | Ohzu et al. | 257/369 |
| 5,682,048 | 10/1997 | Shinohara et al. | 257/342 |

FOREIGN PATENT DOCUMENTS

| | | |
|---|---|---|
| 55-48972 | 4/1980 | Japan . |
| 63-173371 | 7/1988 | Japan . |
| 3-167879 | 7/1991 | Japan . |
| 4-165678 | 6/1992 | Japan . |
| 6-151867 | 5/1994 | Japan . |

*Primary Examiner*—Mahshid Saadat
*Assistant Examiner*—George C. Eckert, II
*Attorney, Agent, or Firm*—Foley & Lardner

[57] ABSTRACT

A UMOS semiconductor device has a surge absorbing structure around a drain lead region. A surge absorbing region such as an anode region or a region forming a punch-through or reach-through structure is formed near the drain lead region, and surrounded by a source region or source regions. The surge absorbing region forms a diode such as a zener diode with a highly doped buried layer or a drain region. With the diode, the surge absorbing structure controls the electric field around the drain lead region and thereby protects the gate insulating film from being damaged by a drain surge.

25 Claims, 7 Drawing Sheets

SEMICONDUCTOR DEVICE

The contents of a Japanese Patent Application No. 8-291660 with a filing date of Nov. 1, 1996 in Japan are hereby incorporated by reference.

BACKGROUND OF THE INVENTION

The present invention relates to a semiconductor device such as a U groove type power semiconductor (called UMOS), and more specifically to a device structure providing an improved withstanding ability against breakdown due to surge voltage as well as a low on resistance.

One conventional example of the UMOS structure is disclosed in a Japanese Patent Provisional Publication No. 63-173371. FIG. 9 shows the sectional structure of this conventional example. In this example, an $N^+$ buried layer 13 is formed in an upper surface of a P type substrate 12, and buried under an $N^-$ type withstand layer 14. An $N^+$ drain lead region 19 extends deep from the topside semiconductor surface to the $N^+$ buried layer 13, and thereby connects a topside drain electrode 29 with the buried layer 13. Gate polysilicon 24 is filled in a U groove formed in the top side surface and covered with a gate oxide film. An $N^+$ source region 17 surrounds the polysilicon gate portion 24. The withstand region 14 serves as a drain region. Gate and source electrodes 25 and 26 are formed above the topside surface of the substrate.

In this structure, the withstand region 14 is separated from other withstand regions in the same substrate by junction isolation, and each isolated withstand region is used for one driver. Therefore, a plurality drivers can be readily formed in the same substrate by forming the buried layer 13, the drain lead region 19 and the drain electrode 29 independently.

However, this conventional example is silent about the lateral layout of the drain and source regions. Besides, this conventional device is guardless against a surge applied to the drain. When a positive surge is applied to the drain lead region 19, the electric field becomes maximum just under the gate polysilicon 24, and tends to damage the gate insulating film at the bottom of the gate polysilicon groove. In this case, the dielectric breakdown is a field breakdown, not a breakdown by power. Therefore, the momentary application of excessive field can cause damage. The problem is made worse, as compared with Si, by the use of material, such as SiC, having a high breakdown field for regions in which circuit components are formed, the problem is

SUMMARY OF THE INVENTION

It is therefore an object of the present invention to provide a groove type power semiconductor device capable of withstanding surge voltages.

It is another object of the present invention to provide a groove type power semiconductor device having a superior capability of withstanding drain surges and a low on resistance.

According to the present invention, a semiconductor device comprises:

a drain proper region (or main drain region) of a first conductivity type such as the N type formed in a semiconductor substrate;

a base region of a second conductivity type such as the P type extending into said semiconductor substrate from a first (or topside) major surface of said semiconductor substrate to said drain proper region;

a source region of the first conductivity type extending into said semiconductor substrate from said first major surface to said base region;

a gate electrode insulated by a gate insulating film and formed in a groove extending into said semiconductor substrate from said first major surface and adjoining said base region and said source region;

a drain electrode formed above said first major surface of said semiconductor substrate;

a source electrode formed above said first major surface of said semiconductor substrate and connected with said base and source regions;

a low resistivity region, such a highly doped layer of the first conductivity type, formed under said drain proper region;

a drain lead region extending into said semiconductor substrate from said first major surface to said low resistivity region and connecting said drain electrode and said low resistivity region; and a surge absorbing section comprising a surge absorbing nearby region formed near said drain lead region.

In illustrated embodiments of the present invention, the surge absorbing region is a doped region of the second conductivity type formed in the drain proper region and separated from the drain lead region by the drain proper region.

The surge absorbing section forms a diode structure, such as zener diode, punch-through structure or reach-through structure, for controlling the electric field around the drain lead region to prevent the field at the bottom of the gate electrode from reaching a breakdown magnitude when a positive voltage surge is applied to the drain lead region.

BRIEF DESCRIPTION OF THE DRAWINGS

FIG. 1A is a plan view, and FIG. 1B is a sectional view taken across a line IB—IB of FIG. 1A.

FIG. 2A is a plan view, and FIG. 2B is a sectional view taken across a line IIB—IIB of FIG. 2A.

FIG. 3A is a plan view, and FIG. 3B is a sectional view taken across a line IIIB—IIIB of FIG. 3A.

FIG. 4A is a plan view, and FIG. 4B is a sectional view taken across a line IVB—IVB of FIG. 1A.

FIG. 5A is a plan view, and FIG. 5B is a sectional view taken across a line VB—VB of FIG. 5A.

DETAILED DESCRIPTION OF THE INVENTION

Figure 1A:
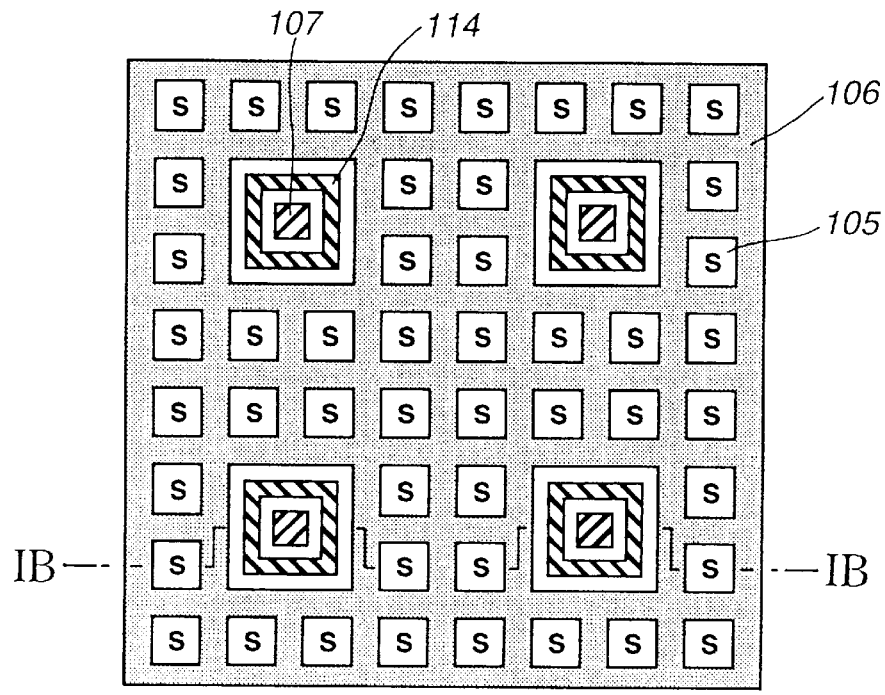
FIGS. 1A and 1B show a semiconductor device according to a first embodiment of the present invention.
Figure 1B:
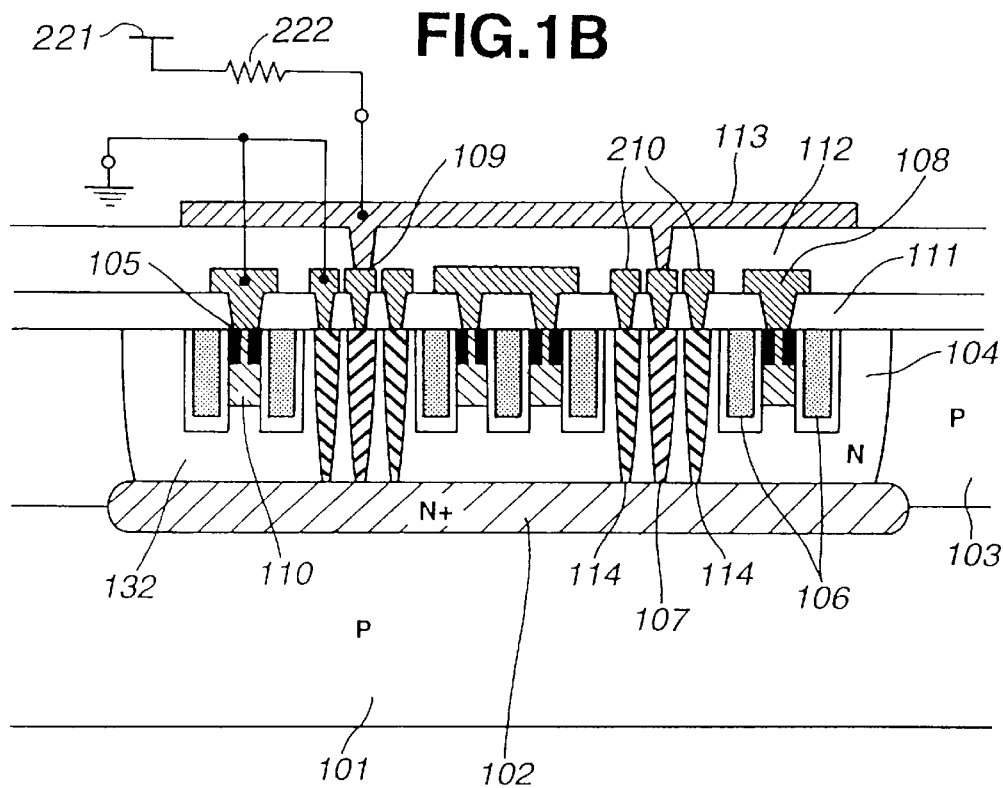

A first embodiment of the present invention is shown in FIGS. 1A and 1B. FIG. 1A shows a lateral geometry of a semiconductor device of this embodiment, and FIG. 1B shows a sectional structure of the device.

The semiconductor device includes a P type semiconductor substrate 101, a low resistivity layer 102 in the form of an $N^+$ buried layer formed in a first major surface of the substrate 101, a P type epitaxial layer 103 grown on the first major surface of the substrate 101.

The semiconductor device further includes at least one N well region 104 formed in the epitaxial layer 103, at least one P type base region 110 formed in the N well region 104, at least one $N^+$ drain lead region 107 formed in the N well region 104. A highly doped $N^+$ source region 105 is formed in the P base region 110 (or each base region 110). There is further formed at least one U-shaped gate portion 106 having one side contiguous with the adjacent P base region 110 and highly doped $N^+$ source region 105. The remaining N well region 104 serves as a drain (proper) region 132.

Topside source and drain electrodes 108 and 109 are insulated from the U shaped gate portion 106 by a first interlayer insulating film 111. A second level drain electrode 113 is insulated from the source electrode 108 by a second interlayer insulating film 112.

At least one anode region 114 of the P type is formed in the N well region 104 near the (or each) drain lead region 107. In this example, each drain lead region 107 is surrounded by a unique one of the anode regions 114. Each anode region 114 is separated from the adjacent drain lead region 107 by the drain proper region 132. The U gate 106 surrounds each anode region 114. Each anode region 114 is further surrounded by the P base regions 110 and the source regions 105. An anode electrode 210 connected with the anode regions 114 is so connected as to make the potential of the anode electrode 210 lower than the potential of the drain region 132, preferably substantially equal to the potential of the source electrode 108. In the example shown in FIG. 1B, the source electrode 108 and the anode electrode 210 are connected together and grounded, and the drain electrode 109 is connected with a power supply 221 through a load 222. The gate electrode 106 is connected with a gate control circuit.

Normally, carriers can flow in each device unit from the source region 105, through the side surface of the U gate portion 106, the N well region 104 (that is, the drain region 132), the $N^+$ buried layer 102 and the drain lead region 107, to the drain electrode 109. This semiconductor device serves as a switch controlled by the voltage of the U gate portion 106.

If a positive surge is applied to the drain electrode 109 in the off state of the semiconductor device, the electric field around the drain lead region 107 in each unit is controlled, so as to prevent a breakdown field at or near the bottom of the U gate portion 106, by a zener diode formed by the bottom of the anode region 114 and the $N^+$ buried layer 102, and/or a zener diode formed by the side surface of the anode region 114 and the drain region 132 (or the drain lead region 107). As a result, this structure can prevent a dielectric breakdown of the gate insulating film due to drain surge.

Around the drain lead region 107, the maximum electric field is determined by a PN junction, not by an insulating film, so that the breakdown mode is the power breakdown. Therefore, it is possible to prevent damage around the drain lead region by designing a maximum field range in accordance with an assumed magnitude of surge.

The structure shown in FIG. 1A and 1B are similar in many respects to the structure disclosed in a copending U.S. patent application Ser. No. 08/648,965, filed on May 17, 1996. Therefore, the structure shown in FIGS. 1A and 1B can reduce the on resistance in addition to the effect of improving the withstanding ability against dielectric breakdown. In the example of FIG. 1A, source cells and drain cells are arranged in a regular periodic manner. In the lateral geometry shown in FIG. 1A, each drain cell is surrounded by twelve of the source cells. A unit of twelve source cells surrounding one drain cell is repeated regularly in a plane parallel to the semiconductor surface of the epitaxial substrate. In each unit, the drain lead region 107 and the anode region 114 are formed in a center zone which is square in this example. The center zone is surrounded by a first outer zone in which the gate electrode 106 is formed. The first outer zone is surrounded by a source perforated zone in which at least one source opening is formed. In this example, twelve square source holes are arranged regularly in a square. the source perforated zone is surrounded by a surrounding zone of the gate electrode 106. Between two adjacent drain cells, there are two rows of square source holes. This pattern improves the degree of integration of the channel and makes it possible to reduce the device's on resistance.

Figure 2A:
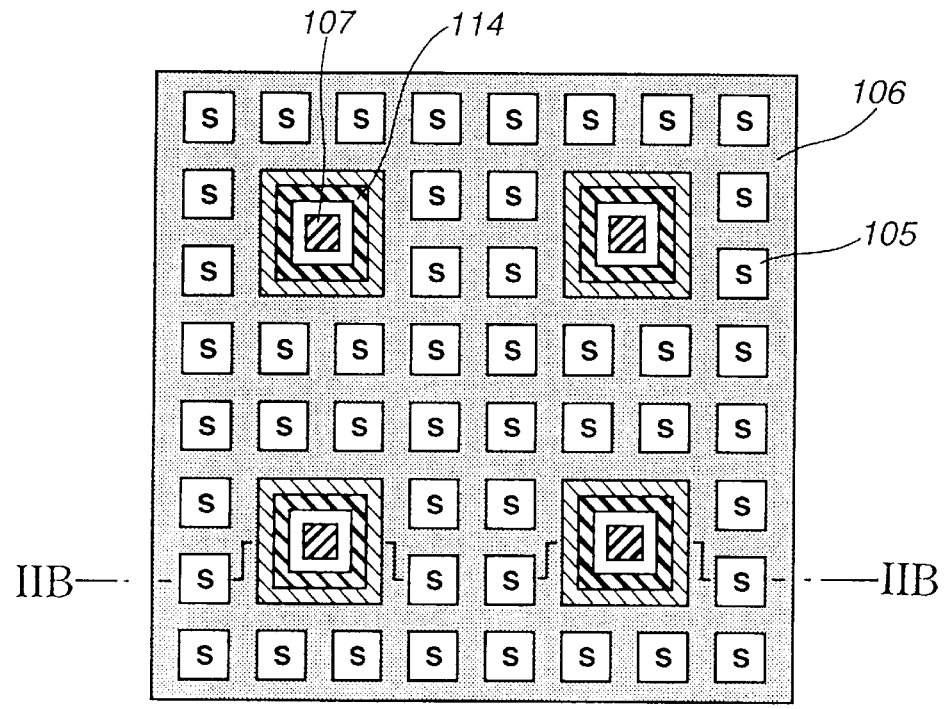
FIGS. 2A and 2B show a semiconductor device according to a second embodiment of the present invention.
Figure 2B:
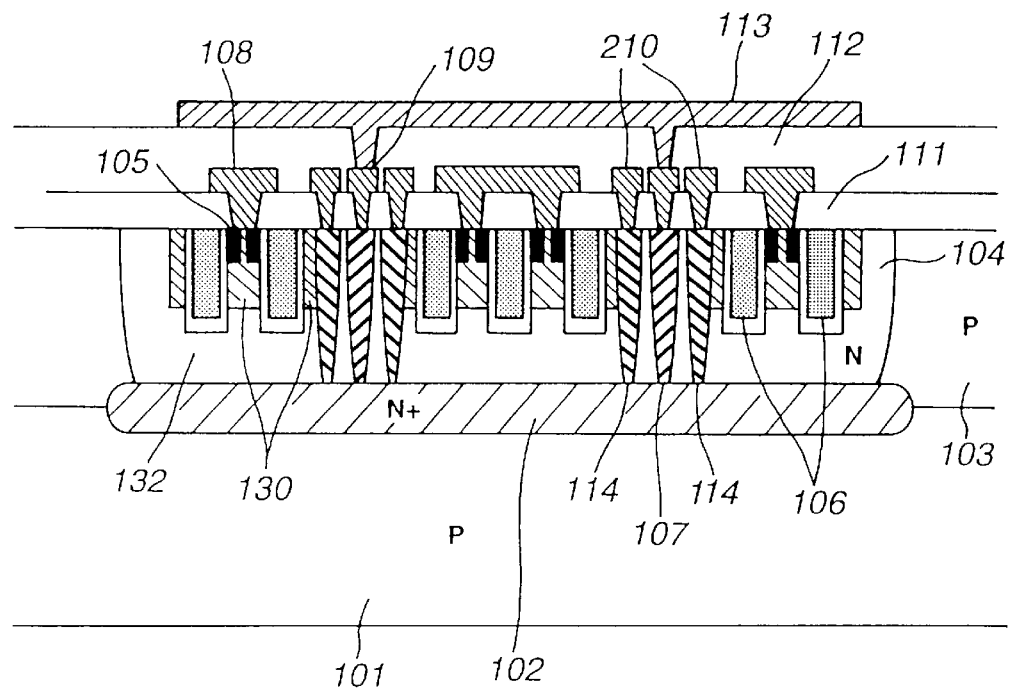

A second embodiment of the present invention is shown in FIGS. 2A and 2B. A semiconductor device according to the second embodiment is almost the same as the device shown in FIGS. 1A and 1B, but different in the following points. In the second embodiment, the P type base region 130 is extended outside the U gate portion 106. In this example, the base region 130 reaches the anode region 114. The base region 130 of this example has an inner portion surrounded by the gate electrode portion 106 and an outer portion formed between the gate electrode portion 106 and the anode region 114.

This design can decrease a potential rise on the side surface of the U gate portion 106 caused by a drain surge, and further reduce the danger of dielectric breakdown of the gate insulating film.

Figure 3A:
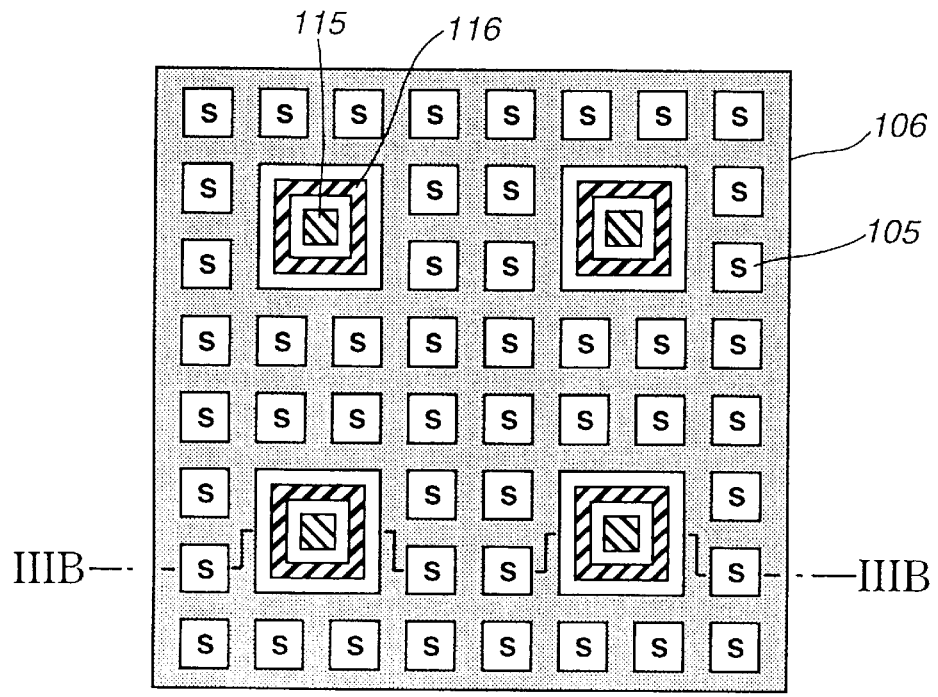
FIGS. 3A and 3B show a semiconductor device according to a third embodiment of the present invention.
Figure 3B:
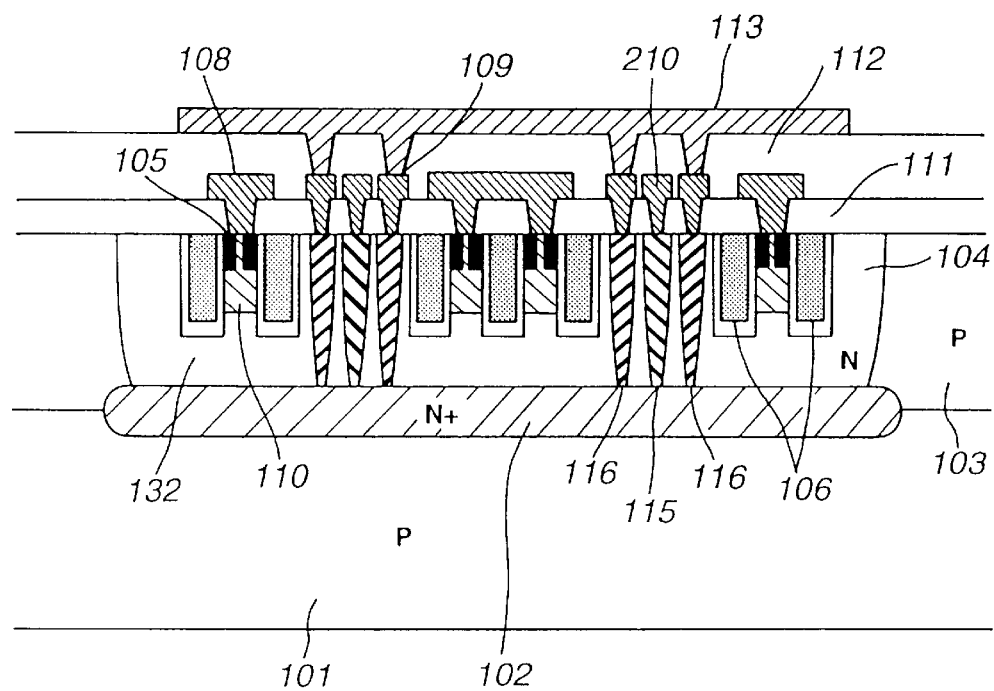

A third embodiment of the present invention is shown in FIGS. 3A and 3B. A semiconductor device according to the third embodiment is almost the same as the device shown in FIGS. 1A and 1B, but different in the following points. In each unit cell of the third embodiment, an anode region 115 is formed at a center, and a drain lead region 116 surrounds the anode region 115.

In the third embodiment, the area of the zener diode in the bottom and side surface is almost the same. However, the drain lead region 116 has a larger sectional size in the cross section perpendicular to the vertical direction along which the main current path extends. As a result, the third embodiment can reduce the resistance of the drain lead region 116. The resistance of the drain lead region is influential in the total resistance of the device specifically when the device's on resistance is reduced by the device structure and pattern. The third embodiment is effective in reducing the total resistance.

In the embodiments shown in FIGS. 1A~3B, each source cell (source region 105) is square in the plan view. However, it is optional to employ circular cells, hexagonal cells or cells of some other radially symmetrical shape. Furthermore, cells may be rectangular, or cells may be nonuniform in size and shape.

Figure 4A:
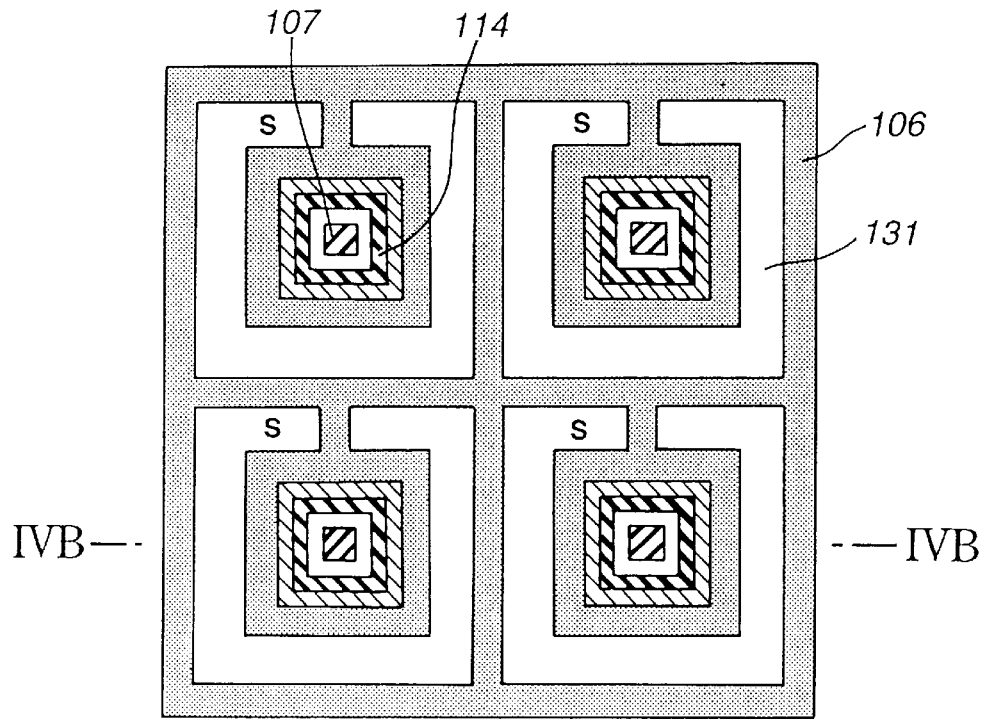
FIGS. 4A and 4B show a semiconductor device according to a fourth embodiment of the present invention.
Figure 4B:
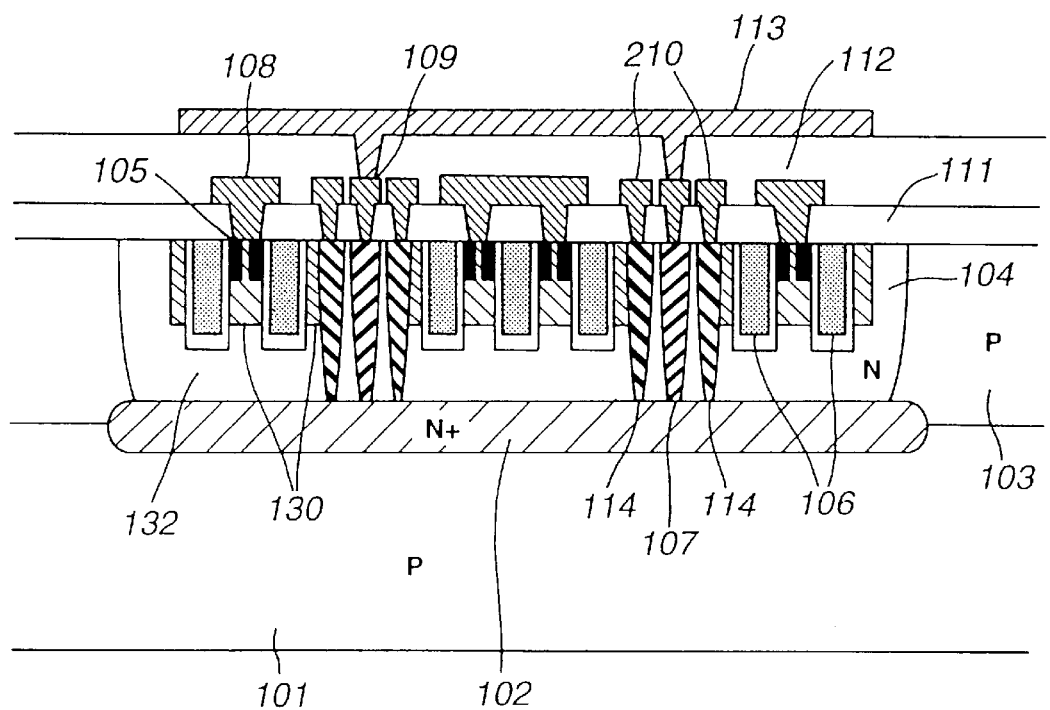

A fourth embodiment of the present invention is shown in FIGS. 4A and 4B. In the fourth embodiment, the sectional design of FIG. 2B is applied to a pattern layout in which each source perforated zone is formed with a continuous long hole. In this example, the long source hole and a source region 131 extend so as to describe a square surrounding the drain lead region 107 at the center, as shown in FIG. 4A. Both ends of the long source hole confront each other at the middle of one side of the square, and there is formed, between both ends, a gap in which the gate electrode is formed.

The fourth embodiment can protect the gate insulating film from being damaged by drain surge field, and reduce the on resistance like the third embodiment. In the fourth embodiment, it is optional to employ the surge absorbing structure having the anode region 114 at the center and the drain lead region 107 surrounding the center anode region 114 as shown in FIGS. 3A and 3B. This center anode surge absorbing structure formed in the pattern of FIG. 4A can protect the gate insulating film like the center drain lead surge absorbing structure.

Figure 5A:
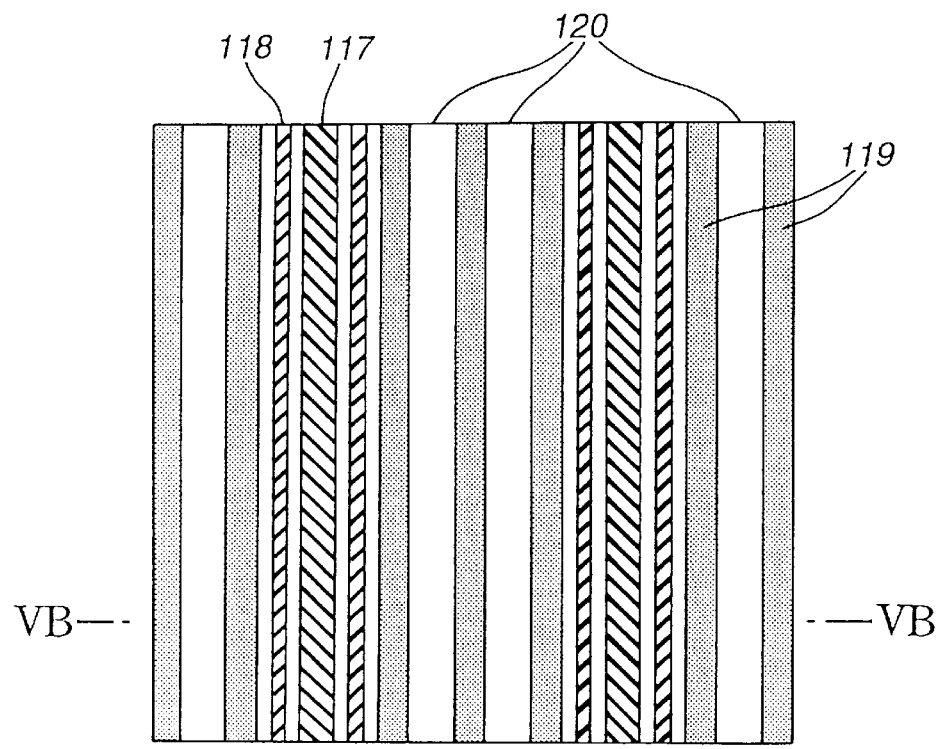
FIGS. 5A and 5B show a semiconductor device according to a fifth embodiment of the present invention.
Figure 5B:
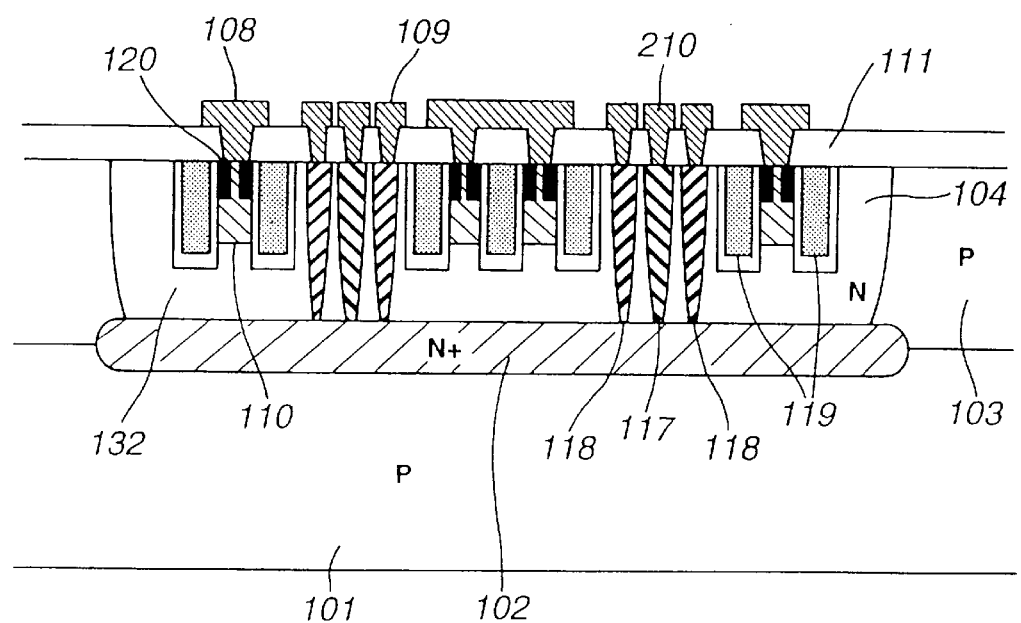

A fifth embodiment of the invention is shown in FIGS. 5A and 5B. In the fifth embodiment, the cross sectional design of FIG. 3B is applied to a semiconductor device of a stripe pattern. In each unit of the pattern of this example, two drain lead regions 118 of a straight stripe shape extends in parallel to each other, and an anode region 117 of a straight stripe shape extends between the two drain lead regions 118, as shown in FIG. 5A. The anode region 117 and the drain lead regions 118 are thus formed in a center stripe zone, which extends between two source stripe regions 120. On each side of the center zone, a stripe of the gate electrode 119 extends between the drain lead region 118 and the source region 120. In this example, the width of the anode stripe region 117 at the middle is greater than the width of the drain lead stripe regions 118 on both sides.

The fifth embodiment can prevent the gate insulating film from being damaged by drain surge field and reduce the on resistance like the third embodiment.

In the parallel stripe pattern of this embodiment, it is optional to form the drain lead stripe region 118 at the middle, and two anode stripe regions 117 on both sides of the drain lead region 118 as in the cross sectional structure of FIG. 2B. This pattern can also prevent the damage of the gate insulting film due to the electric field of a drain surge.

Figure 6:
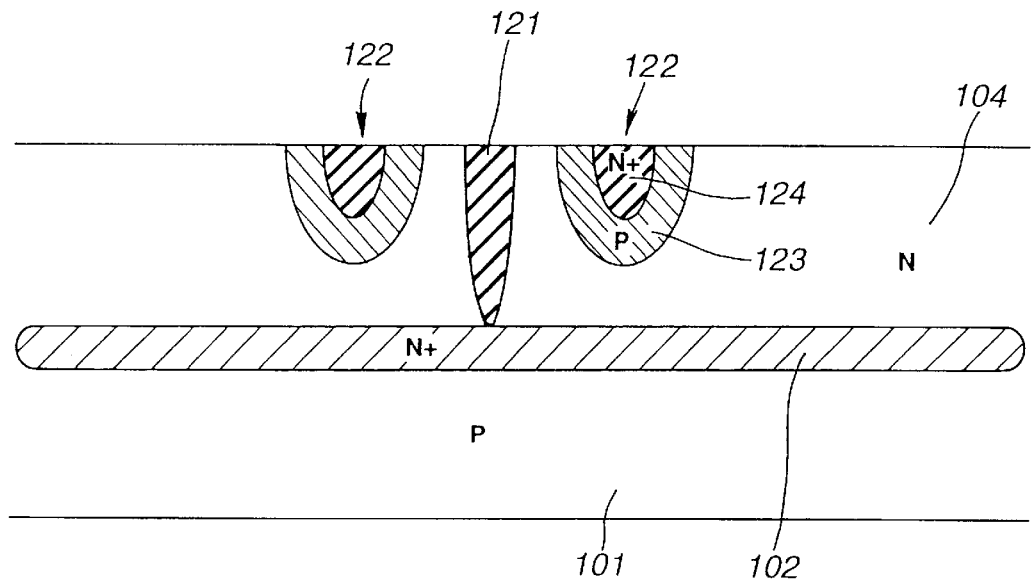
FIG. 6 is a sectional view showing a surge absorbing structure according to a sixth embodiment of the present invention.

A sixth embodiment of the present invention is shown in FIG. 6. FIG. 6 shows only a surge absorbing structure formed around one drain lead region 121 to improve the field strength around the drain lead region 121 and prevent the gate insulating film from being damaged by a drain surge. In the surge absorbing structure of FIG. 6, an N⁺ type drain lead region 121 is formed at the center, and a surge absorbing section 122 surrounds the center drain lead region 121. (In another design, the center drain lead region 121 is formed between two surge absorbing sections 122.) The surge absorbing section 122 forms a punch-through diode. The surge absorbing section 122 comprises a P type diffusion layer or region 123 and an N⁺ diffusion layer or region 124. The N⁺ diffusion region 124 is formed in the P type region 123. In this example, the N⁺ type layer 124, the P type layer 123 and the N well region 104 form an N-P-N punch-through structure as shown in FIG. 6. It is possible to employ a P-N-P punch-through structure instead of the N-P-N structure. In the punch-through structure, a large punch-through current flows when a punch-through voltage of a predetermined magnitude is applied.

When a large positive surge is applied to the drain lead region 121, the depletion layer extends around the junction between the P type diffusion layer 123 and the N well region 104. In the punch-through structure, a punch-through occurs when the depletion layer extends in the P type diffusion layer 123, and reaches the N⁺ diffusion region 124. By appropriately determining the width of the P diffusion layer 123, the surge absorbing structure is so designed that the depletion layer extends completely across the P layer 123 and a punch through current flows when a predetermined surge voltage is applied. The flow of punch-through current prevents a further increase of the electric field immediately under the gate insulating film, and protects the gate insulating film.

In the example shown in FIG. 6, the P type diffusion region 123 does not reach the N⁺ buried layer 102. However, it is optional to make the P type diffusion region 123 so deep that the P type region 123 touches the buried layer 102. Such a deep surge absorbing structure can provide the same effect.

Figure 7:
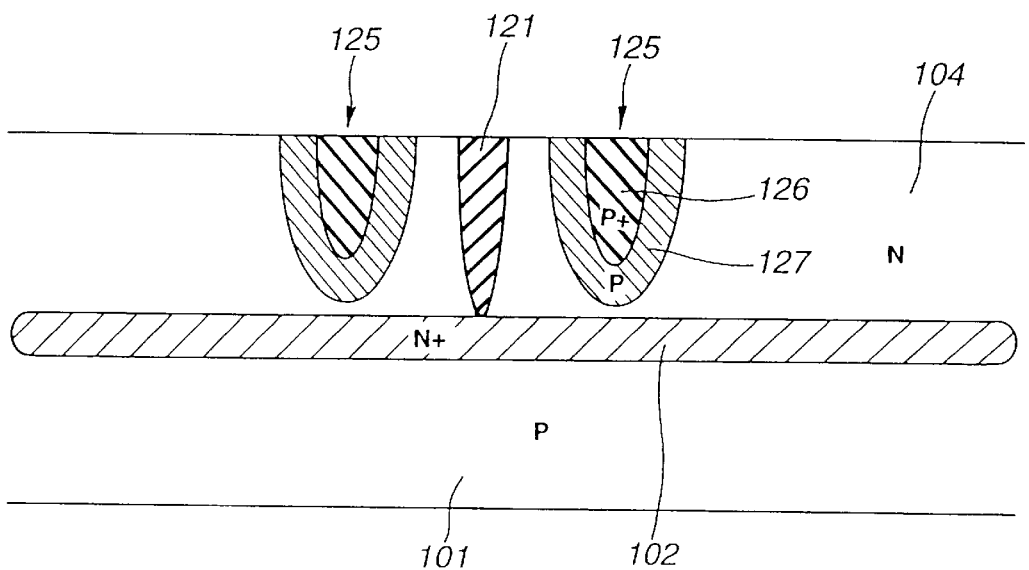
FIG. 7 is a sectional view showing a surge absorbing structure according to a seventh embodiment of the present invention.

A seventh embodiment is shown in FIG. 7. FIG. 7 shows only a surge absorbing structure for increasing the field strength around the drain lead region 121 and preventing the gate insulating film from being damaged by a drain surge. In the surge absorbing structure of FIG. 7, the N⁺ type drain lead region 121 is formed at the center, and surrounded by a surge absorbing section 125 forming a reach-through diode. (Instead, it is optional to employ the reach-through surge absorbing structure in which the drain lead region 121 is formed between two reach-through type surge absorbing sections 125.) The reach-through surge absorbing section 125 comprises a P type diffusion layer or region 127 and an P⁺ diffusion layer or region 126. The P⁺ diffusion region 126 is formed in the P type region 127. In this example, the P⁺ type layer 126, the P type layer 127 and the N well region 104 form an P-P-N structure as shown in FIG. 7. It is possible to employ a N-N-P reach-through structure instead of the P-P-N structure. In the reach-through structure, a large reach-through current flows when a reach-through voltage of a predetermined magnitude is applied.

When a large positive surge is applied to the drain lead region 121, the depletion layer extends between the P type diffusion layer 127 and the N well region 104. In the reach-through structure having the P type layer 127 of an appropriately determined width, a predetermined surge voltage causes the depletion layer in the P type diffusion layer 127 to reach the P⁺ diffusion region 126. At this instant, a breakdown occurs and a current flows. Therefore, this surge absorbing structure protects the gate insulating film by preventing an electric field underneath the gate insulating film from being further increased.

In the example shown in FIG. 7, the P type diffusion region 127 does not reach the N⁺ buried layer 102. However, it is optional to make the P type diffusion region 127 so deep that the P type region 127 touches the buried layer 102. Such a deep surge absorbing structure can provide the same effect.

Figure 8:
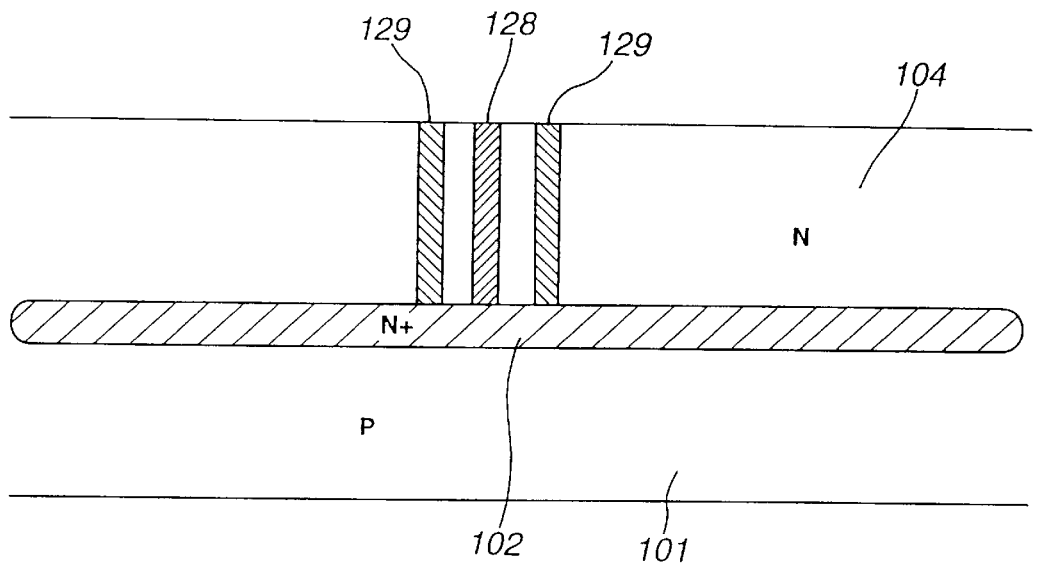
FIG. 8 is a sectional view showing a surge absorbing structure according to an eighth embodiment of the present invention.
Figure 9:
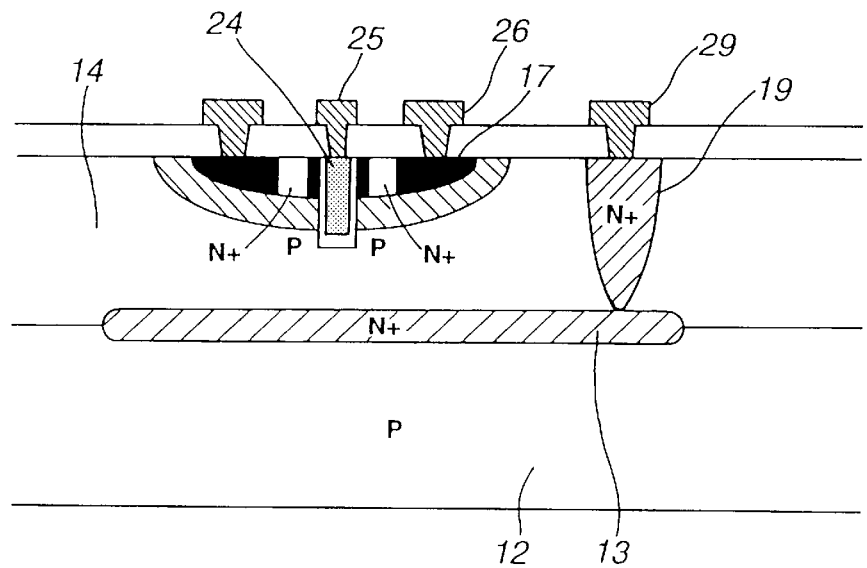
FIG. 9 is a sectional view showing a conventional UMOS structure.

An eighth embodiment of the present invention is shown in FIG. 8. In this embodiment, the surge absorbing structure similar to that of the first embodiment is formed by trench forming and refilling techniques. In the example of FIG. 8, a groove type drain lead region 128 and a groove type anode region 129 are formed by the trench techniques. The groove type drain lead region 128 is at the center, and surrounded by the groove type anode region 129. This structure can reduce the area of the drain takeout region including the surge absorbing structure.

In the embodiments shown in FIGS. 1A~5B and 8, the anode region 114, 115, 117 or 129 extends from the upper surface of the N well region 104 (i.e. the drain proper region 132) to the N⁺ buried layer 102. In each embodiment, however, it is possible to employ a shallow anode region which does not reach the N⁺ buried layer 102. In this case, the anode region has a lower end bounded by the N well region 104. The anode region has an upper end bared in the upper semiconductor surface of the epitaxial substrate, and connected with the fourth electrode 210 through an opening formed in the insulating layer on the semiconductor surface.

The surge absorbing structures of the sixth, seventh and eight embodiments are applicable to any of the first through fifth embodiments.

What is claimed is:

1. A semiconductor device comprising:
    a drain proper region of a first conductivity type formed in a semiconductor substrate;
    a base region of a second conductivity type extending into said semiconductor substrate from a first major surface of said semiconductor substrate to said drain proper region;
    a source region of the first conductivity type extending into said semiconductor substrate from said first major surface to said base region;
    a gate electrode insulated by a gate insulating film and formed in a groove extending into said semiconductor substrate from said first major surface and adjoining said base region and said source region;
    a drain electrode formed above said first major surface of said semiconductor substrate and connected with said base region and said source region;
    a low resistivity region formed under said drain proper region;
    a drain lead region extending into said semiconductor substrate from said first major surface to said low resistivity region and connecting said drain electrode and said low resistivity region; and
    a surge absorbing section comprising a nearby region of the second conductivity type formed near said drain lead region;
    wherein the sure absorbing section is formed in the drain proper region, and the nearby region is separated from the drain lead region by the drain proper region.

2. A semiconductor device as claimed in claim 1:
    wherein the semiconductor device further comprises a first insulating layer formed on said first major surface of said semiconductor substrate, said first insulating layer being formed with a drain opening for connecting said drain electrode with said drain lead region and source opening for connecting said source electrode with said base region and said source region;
    wherein one of said source electrode and said drain electrode comprises a first level conductive portion formed on said first insulating layer, the other of said source electrode and said drain electrode comprises a second level conductive portion, and said semiconductor device further comprises a second insulating layer formed between said first level conductive portion and said second level conductive portion so as to form a double layer interconnection structure in which said first level conductive portion and said second level conductive portion are insulated from each other by said second insulating layer;
    wherein said source opening extends around said drain opening so as to enclose said drain opening, and said gate electrode is formed around said source opening; and
    wherein said source opening comprises one of a stripe-shaped opening and a series of separate openings, and extends around said drain opening along a shape similar to a frame of said drain opening and, said first insulating layer is formed with a plurality of said drain openings and a plurality of said source openings, which are regularly arranged.

3. A semiconductor device as claimed in claim 2 wherein a plurality of said source openings extend between two adjacent ones of said drain openings.

4. A semiconductor device as claimed in claim 1 wherein the nearby region is an anode region forming a zener diode with the drain proper region.

5. A semiconductor device as claimed in claim 4 wherein the anode region extends to the low resistivity region which is a highly doped region of the first conductivity type and forms a zener diode with the highly doped region, and wherein the anode region is connected with a fourth electrode formed above the first major surface of the semiconductor substrate and separated from the drain electrode.

6. A semiconductor device as claimed in claim 1 wherein the surge absorbing section further comprises an inner region of the first conductivity type formed in the nearby region, and the nearby region is a punch-through region of the second conductivity type extending between the inner region and drain proper region of the first conductivity type and forming a punch-through structure with the inner region and the drain proper region.

7. A semiconductor device as claimed in claim 6 wherein the inner region is enveloped and separated by the nearby region from the drain proper region, and wherein the inner region of the surge absorbing section is connected with a fourth electrode formed above the first major surface of the semiconductor substrate and separated from the drain electrode.

8. A semiconductor device as claimed in claim 1 wherein the surge absorbing section further comprises an inner region of the second conductivity type formed in the nearby region, the nearby region of the second conductivity type is a reach-through region extending between the inner region of the second conductivity type and the drain proper region of the first conductivity type and forming a reach-through structure with the inner region and drain proper region.

9. A semiconductor device as claimed in claim 8 wherein the inner region is enveloped and separated by the nearby region from the drain proper region, wherein the inner region is a highly doped region of the second conductivity type and the nearby region is a lightly doped region of the second conductivity type, and wherein the inner region is connected with a fourth electrode formed above the first major surface of the semiconductor substrate and separated from the drain electrode.

10. A semiconductor device as claimed in claim 1:
    wherein the low resistivity region is a highly doped region of the first conductivity type;
    wherein the nearby region comprises a lower end forming a PN junction with one of the drain proper region and the low resistivity region;
    wherein the drain proper region comprises a wall portion of the first conductivity type bounded between the drain lead region and the nearby region, the drain lead region, the nearby region and the wall portion of the drain proper region extend vertically from the first major surface alongside one another toward the low resistivity region, the wall portion of the drain proper region comprises first and second opposite side surfaces, the first side surface of the wall portion of the drain proper region is contiguous with the nearby region, and the second side surface of the wall portion of the drain proper region is contiguous with the drain lead region; and wherein each of the drain lead region and the nearby region is one of an impurity diffusion region extending from the first major surface into the semiconductor substrate, and a trench region formed in a trench extending from the first major surface into the semiconductor substrate.

11. A semiconductor device as claimed in claim 1 wherein one of the surge absorbing section and the drain lead region comprises first and second side portions and the other of the surge absorbing section and the drain lead region comprises a center portion located between the first and second side portions.

12. A semiconductor device as claimed in claim 11 wherein the center portion is surrounded by the first and second side portions which are connected together continuously.

13. A semiconductor device as claimed in claim 1 wherein the drain lead region and the surge absorbing section are separated by the gate electrode from the source region in a lateral layout of the semiconductor device.

14. A semiconductor device as claimed in claim 13 wherein the drain lead region and the surge absorbing section are surrounded by the gate electrode, which is in turn surrounded by the source region.

15. A semiconductor device as claimed in claim 14 wherein the first major surface of the semiconductor substrate is patterned with a regular periodic arrangement of unit surface sections each of which comprises a center zone in which the drain lead region and the surge absorbing section are formed, a first outer zone in which the gate electrode is formed, and a second outer zone in which the source region is formed, and the second outer zone is separated from the center zone by the first outer zone.

16. A semiconductor device as claimed in claim 15 wherein the center zone is completely surrounded by the first outer zone, which is in turn surrounded by the second outer zone, and each of the center and outer zones is in a form of a radially symmetrical plane figure.

17. A semiconductor device as claimed in claim 1:
wherein one of the source electrode and the drain electrode comprises a first level conducive portion and the other of the source electrode and the drain comprises a second level conductive portion, the first conductive portion and the second conductive portion are separated by an interlayer insulating film which is sandwiched between the first conductive portion and the second conductive portion to form a double level interconnection structure; and
wherein the semiconductor device further comprises a first insulating layer formed on the first major surface of the semiconductor substrate, the first insulating layer comprises a drain opening for connecting the drain electrode with the drain lead region, and a source perforated zone for connecting the source electrode with the source region and the base region, the drain opening is enclosed by the source perforated zone.

18. A semiconductor device as claimed in claim 17:
wherein the first insulating layer is formed with a regular periodic pattern of unit sections each of which comprises the drain opening, and the source perforated zone surrounding the drain opening;
wherein the source perforated zone of each unit section is formed with one of a series of source holes and a continuous elongated hole;
wherein an outside boundary of the drain opening and an inside boundary of the source perforated zone are similar figures in each unit section;

wherein the drain opening of each unit section is surrounded by the gate electrode; and
wherein a plurality of the source perforated zones extend between two adjacent ones of the drain openings.

19. A semiconductor device as claimed in claim 1:
wherein the nearby region is an anode region forming a breakdown diode with one of the drain proper region and the low resistivity layer;
wherein the anode region is so connected as to hold a potential of the anode region at one of a first level lower than a potential of the drain proper region and a second level substantially equal to a potential of the source region; and
wherein there is formed, between the anode region and the gate electrode, one of the drain proper region and the base region.

20. A semiconductor device as claimed in claim 1:
wherein the surge absorbing section further comprises a highly doped inner region formed in the nearby region, and so connected as to hold a potential of the inner region at one of a first level lower than a potential of the drain proper region and a second level substantially equal to a potential of the source region; and
wherein the nearby region is interposed between the drain proper region and the inner region to form one of NPN, PNP, PPN and NNP structures.

21. A semiconductor device as claimed in claim 1:
wherein the surge absorbing section is connected with a fourth electrode which is separated from the drain electrode, and the source, drain and fourth electrodes are formed on a topside side of the semiconductor substrate; and
wherein the semiconductor device further comprises a substrate layer of the second conductivity type, and an epitaxial layer of the second conductivity type, the low resistivity region is a highly doped buried layer formed between the substrate layer and the epitaxial layer, the drain proper region is a well region formed in the epitaxial layer.

22. A semiconductor device as claimed in claim 21 wherein the fourth electrode and the source electrode are grounded, and the drain electrode is connected through a load with a power supply.

23. A semiconductor device comprising:
a drain proper region of a first conductivity type formed in a semiconductor substrate;
a base region of a second conductivity type extending into said semiconductor substrate from a first major surface of said semiconductor substrate to said drain proper region;
a source region of the first conductivity type extending into said semiconductor substrate from said first major surface to said base proper region;
a gate electrode insulated by a gate insulating film and formed in a groove extending into said semiconductor substrate from said first major surface and adjoining said base region and said source region;
a topside drain electrode formed above said first major surface of said semiconductor substrate;
a topside source electrode formed above said first major surface of said semiconductor substrate and connected with said base and source regions;
a substrate layer;
a low resistivity highly doped buried region formed between said drain proper region and the substrate layer;

a drain lead region extending into said semiconductor substrate from said first major surface to said low resistivity region and connecting said drain electrode and said low resistivity region; and a surge absorbing section comprising a surge absorbing region formed in the drain proper region and separated from the drain lead region by the drain proper region.

24. A semiconductor device as claimed in claim 23 wherein the surge absorbing section is connected with a topside fourth electrode formed above the first major surface of the semiconductor substrate and separated from the drain electrode;

wherein the fourth electrode and the source electrode are grounded, and the drain electrode is connected through a load with a power supply;

wherein the drain lead region and the surge absorbing section are separated from the source region by the gate electrode; and wherein the surge absorbing region extends from the first major surface of the semiconductor substrate toward the low resistivity region and terminates at a lower end forming a junction with one of the drain proper region and the low resistivity region.

25. A semiconductor device as claimed in claim 23:

wherein a first insulating layer formed on said first major surface of said semiconductor substrate, said first insulating layer being formed with a drain opening for connecting said drain electrode with said drain lead region and a first source opening zone for connecting said source electrode with said source region along said zone;

wherein one of said source and drain electrodes comprises a first level conductive portion formed on said first insulating layer, the other of said source and drain electrodes comprises a second level conductive portion, and said semiconductor device further comprises a second insulating layer formed between said first and second level conductive portions so as to form a double layer interconnection structure in which said first and second level conductive portions are insulated from each other by said second insulating layer;

wherein said source opening zone extends around said drain opening so as to surround said drain opening, and said gate electrode is formed around said source opening; and wherein said first insulating layer is formed with a plurality of said drain openings and a plurality of said first source opening zones, said drain openings and said source opening zones are regularly arranged on said first major surface and separated from one another by a gate area in which said gate electrode is formed, and each of said drain openings is accompanied by a unique one of said source opening zones so that any two adjacent drain openings are separated by a plurality of said source opening zones extending therebetween.

* * * * *